(12) United States Patent
Kuang et al.

(10) Patent No.: US 11,502,198 B2
(45) Date of Patent: Nov. 15, 2022

(54) STRUCTURE AND METHOD FOR INTEGRATED CIRCUIT

(71) Applicant: Taiwan Semiconductor Manufacturing Company, Ltd., Hsinchu (TW)

(72) Inventors: Shin-Jiun Kuang, Hsinchu (TW); Tsung-Hsing Yu, Taipei (TW); Yi-Ming Sheu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/983,833

(22) Filed: Aug. 3, 2020

(65) Prior Publication Data

US 2020/0365735 A1    Nov. 19, 2020

Related U.S. Application Data

(60) Continuation of application No. 15/803,238, filed on Nov. 3, 2017, now Pat. No. 10,741,688, which is a
(Continued)

(51) Int. Cl.
| | | |
|---|---|---|
| *H01L 31/119* | (2006.01) | |
| *H01L 29/78* | (2006.01) | |
| *H01L 29/08* | (2006.01) | |
| *H01L 21/8238* | (2006.01) | |
| *H01L 29/267* | (2006.01) | |
| *H01L 29/66* | (2006.01) | |

(Continued)

(52) U.S. Cl.
CPC .. *H01L 29/7848* (2013.01); *H01L 21/823814* (2013.01); *H01L 27/092* (2013.01); *H01L 29/0847* (2013.01); *H01L 29/165* (2013.01); *H01L 29/267* (2013.01); *H01L 29/6653* (2013.01); *H01L 29/66636* (2013.01); *H01L 21/823864* (2013.01)

(58) Field of Classification Search
None
See application file for complete search history.

(56) References Cited

U.S. PATENT DOCUMENTS

| | | | |
|---|---|---|---|
| 6,383,937 B1 | 5/2002 | Tseng | |
| 2002/0000622 A1* | 1/2002 | Yamakawa | ....... H01L 29/41783 257/E21.162 |

(Continued)

FOREIGN PATENT DOCUMENTS

| | | |
|---|---|---|
| CN | 1707796 | 12/2005 |
| CN | 103311237 | 9/2013 |

(Continued)

OTHER PUBLICATIONS

Office Action dated Dec. 2, 2015 in Korean Patent Application No. 10-2014-0181445 filed Dec. 16, 2014.

*Primary Examiner* — Ali Naraghi
(74) *Attorney, Agent, or Firm* — Haynes and Boone, LLP (57) ABSTRACT

The present disclosure provides many different embodiments of an IC device. The IC device includes a gate stack disposed over a surface of a substrate and a spacer disposed along a sidewall of the gate stack. The spacer has a tapered edge that faces the surface of the substrate while tapering toward the gate stack. Therefore the tapered edge has an angle with respect to the surface of the substrate.

20 Claims, 8 Drawing Sheets

Related U.S. Application Data division of application No. 14/305,416, filed on Jun. 16, 2014, now Pat. No. 9,831,341.

(51) Int. Cl.
*H01L 29/165* (2006.01)
*H01L 27/092* (2006.01)

(56) References Cited

U.S. PATENT DOCUMENTS

| | | | | |
|---|---|---|---|---|
| 2002/0190284 | A1* | 12/2002 | Murthy | H01L 29/456 257/E29.054 |
| 2005/0051851 | A1 | 3/2005 | Chen et al. | |
| 2006/0258072 | A1* | 11/2006 | Kavalieros | H01L 29/7391 257/E29.195 |
| 2007/0228357 | A1* | 10/2007 | Wei | H01L 29/66636 257/E29.267 |
| 2009/0026554 | A1* | 1/2009 | Winstead | H01L 29/6653 257/E29.345 |
| 2009/0152646 | A1* | 6/2009 | Zhu | H01L 29/66553 257/E29.345 |
| 2010/0129971 | A1* | 5/2010 | Ohta | H01L 29/045 257/E21.409 |
| 2011/0068407 | A1 | 3/2011 | Yeh et al. | |
| 2011/0227156 | A1 | 9/2011 | Khater et al. | |
| 2012/0181625 | A1 | 7/2012 | Kwok et al. | |
| 2012/0220097 | A1* | 8/2012 | Zhong | H01L 29/66545 438/300 |
| 2013/0316506 | A1 | 11/2013 | Chang et al. | |
| 2014/0048855 | A1 | 2/2014 | Huang et al. | |
| 2014/0048888 | A1 | 2/2014 | Chen et al. | |
| 2014/0127893 | A1* | 5/2014 | Huang | H01L 29/66636 438/590 |
| 2015/0364601 | A1 | 12/2015 | Kuang et al. | |
| 2018/0061986 | A1 | 3/2018 | Kuang et al. | |

FOREIGN PATENT DOCUMENTS

| | | |
|---|---|---|
| CN | 103378006 | 10/2013 |
| JP | 2000-091561 | 3/2000 |
| KR | 2011-0033033 | 3/2011 |
| KR | 2014-0023200 | 2/2014 |
| TW | 201409579 | 3/2014 |

\* cited by examiner

STRUCTURE AND METHOD FOR INTEGRATED CIRCUIT

PRIORITY DATA

The present application is a continuation application of U.S. application Ser. No. 15/803,238, filed Nov. 3, 2017, which is a divisional application of U.S. application Ser. No. 14/305,416, filed Jun. 16, 2014, each of which is hereby incorporated by reference in its entirety.

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, stress effects improve charge mobility through a transistor channel, thereby improving device performance is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
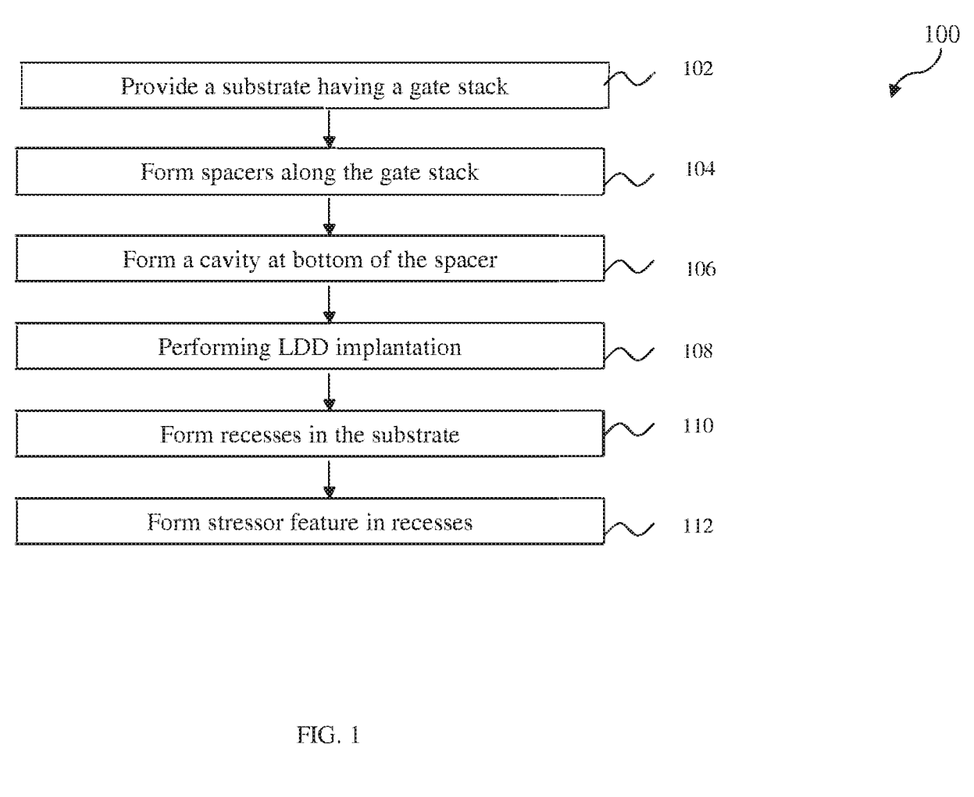
FIG. 1 is a flowchart of an example method for fabricating an integrated circuit (IC) constructed in accordance with some embodiments.

FIG. 1 is a flowchart of a method 100 of fabricating one or more IC devices in accordance with some embodiments. The method 100 is discussed in detail below, with reference to an IC device 200, shown in FIGS. 2, 3, 4A-4C to 7 for the sake of example.

Figure 2:
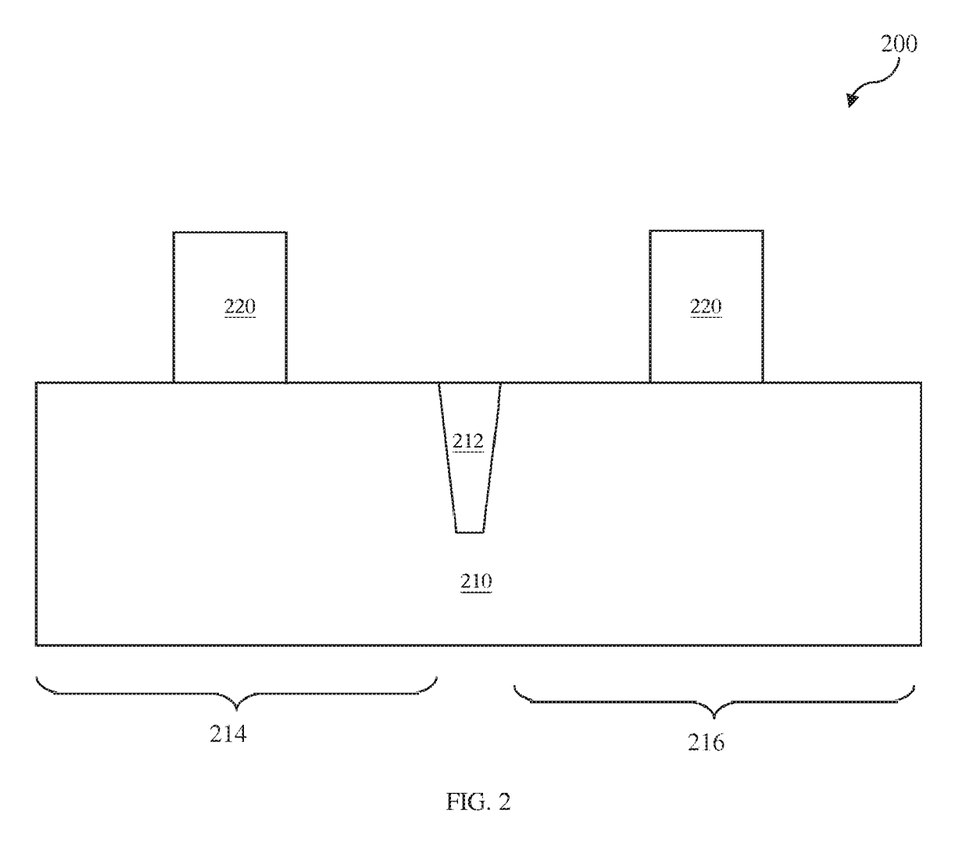
FIGS. 2 to 7 are cross sectional views of an example IC device constructed at fabrication stages in accordance with some embodiments.

Referring to FIGS. 1 and 2, the method 100 start at step 102 by providing a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide, or combinations thereof. Possible substrates 210 also include a silicon-on-insulator (SOI) substrate. SOI substrates are fabricated using separation by implantation of oxygen (SIMOX), wafer bonding, and/or other suitable methods.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type field-effect transistor (NFET) device and regions configured for a p-type field-effect transistor (PFET) device.

The substrate 210 may include isolation features 212 to isolate active regions of the substrate 210. The isolation feature 212 may be formed using traditional isolation technology, such as shallow trench isolation (STI), to define and electrically isolate the various regions. The isolation feature 212 may comprise silicon oxide, silicon nitride, silicon oxynitride, an air gap, other suitable materials, or combinations thereof. The isolation feature 212 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

The STI feature 212 defines various active regions. In one embodiment, the substrate 210 includes a first active region 214 configured for a p-type field-effect transistor (PFET) and a second active region 216 configured for an n-type field-effect transistor (NFET). In one embodiment, the first active region 214 and the second active region 215 are separated by the STI feature 212.

Referring also to FIGS. 1 and 2, the substrate 210 also includes a gate stack 220 disposed over a surface of the substrate 210. The gate stack 220 may include a dielectric layer and a gate electrode layer. The gate stack 220 can be formed by a procedure including deposition, photolithography patterning, and etching processes. The deposition processes may include chemical vapor deposition (CVD), physical vapor deposition (PVD), atomic layer deposition (ALD), or other suitable processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods.

In one embodiment, the gate stack 220 is a dummy gate stack and is replaced later by a high-k/metal gate (HK/MG) stack. The dummy gate stack 220 may include the dielectric layer and the polysilicon layer.

Figure 3:
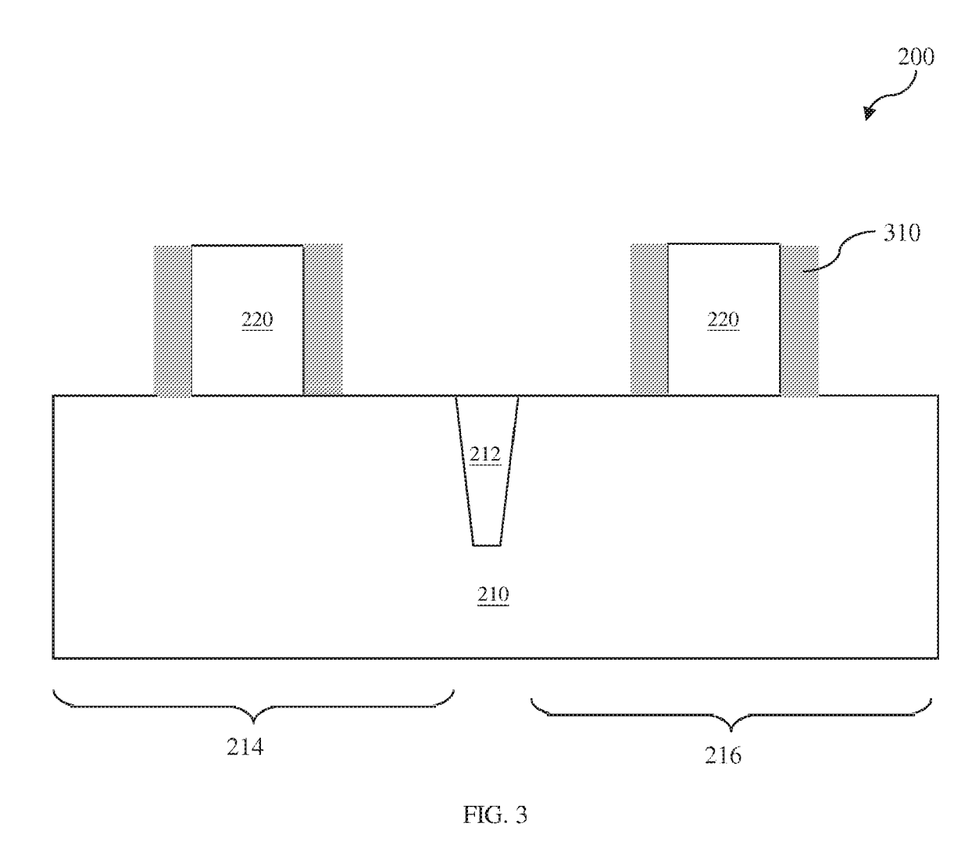

Referring to FIGS. 1 and 3, the method 100 proceeds to step 104 by forming spacers 310 along sidewalls of the gate stack 220. The spacer 310 includes a dielectric material such as silicon oxide. Alternatively, the spacers 310 may include silicon nitride, silicon carbide, silicon oxynitride, or combinations thereof. The spacers 310 may be formed by depositing a dielectric material over the gate stack 220 and then anisotropically etching back the dielectric material. Thus the spacer 310 has a fairly vertical profile. The etching back process may include a multiple-step etching to gain etch selectivity, flexibility and desired overetch control. The spacer 310 may have a multiple-layer structure.

Figure 4A:
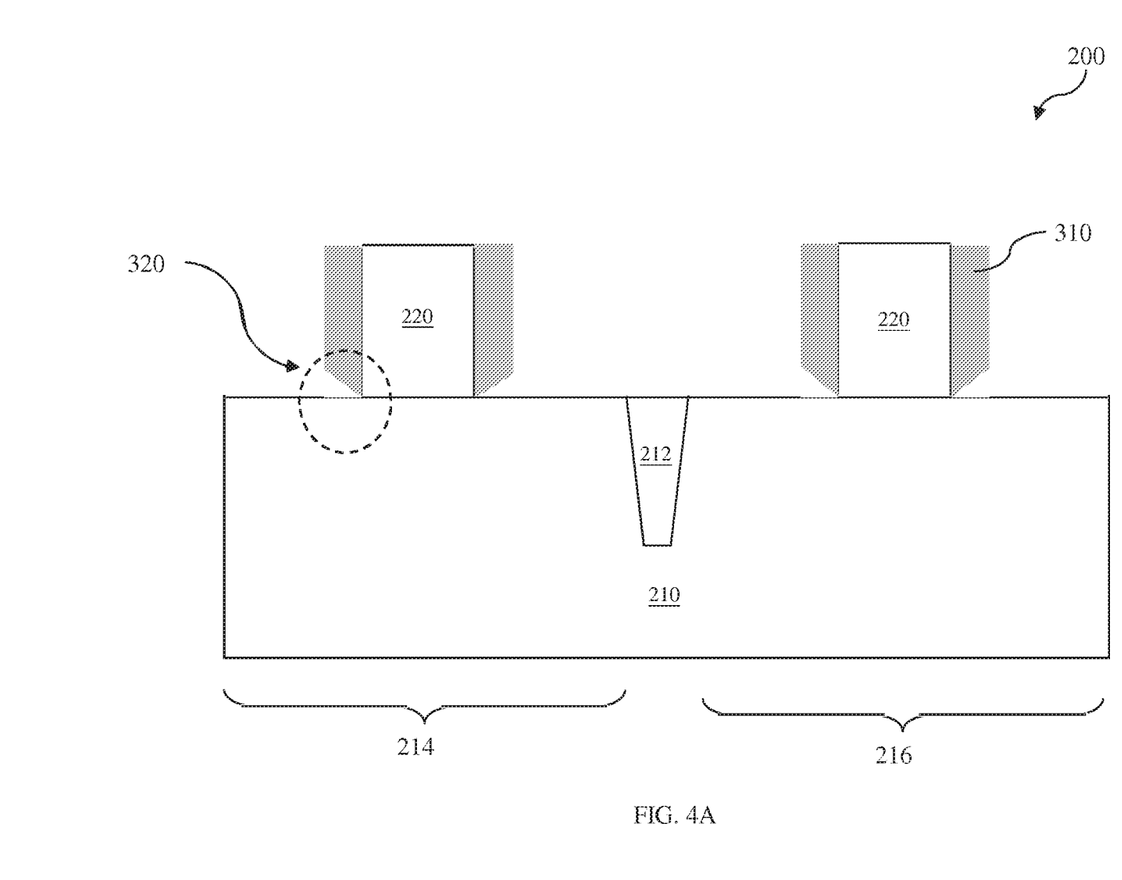
Figure 4B:
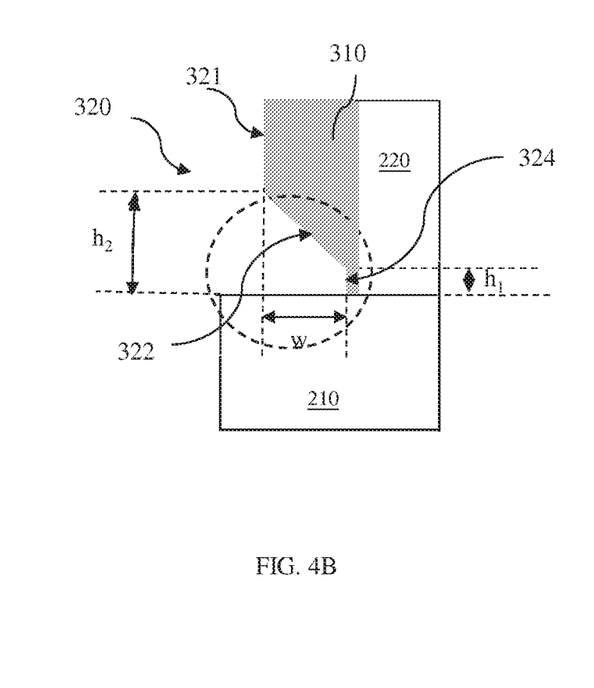

Referring to FIGS. 1 and 4A-4C, the method 100 proceeds to step 106 by forming cavity 320 at a foot of the spacer 310, where the spacer 310 connects to a surface of the substrate 210. The cavity 320 is formed by removing a portion of the spacer 310. In one embodiment, the cavity 320 is formed by a wet etch. In another embodiment, the cavity 320 is formed by a dry etch. The cavity 320 is defined by the spacer 310 having a tapered (or slanted) edge that extends towards the gate stack 220. In one embodiment, the spacer 310 includes a tapered edge 322 (or first edge) and a second edge 324 that define cavity 320. As shown in FIGS. 4A and 4B, first edge 322 interfaces with second edge 324 and the second edge 324 is substantially perpendicular to a top surface of the substrate 210. Additionally, cavity 320 has a bottom width w that extends from second edge 324 to a plane that intersects an interface point between the first edge 322 and a third edge 321 of the spacer 310. As shown, the third edge 321 is substantially perpendicular to the top surface of the substrate 210.

As shown in FIG. 4B, the second edge 324 is adjacent the gate stack 220 and cavity 320 has a first height $h_1$ adjacent the second edge 324. As discussed above, the first edge 322 includes a tapered profile such that the height of the cavity 320 increases as the first edge 322 tapers away from the gate stack toward the third edge 321 of the spacer 310. As shown, the cavity 320 has a second height $h_2$ measured from the interface point between first edged 322 and the third edge 321 to the top surface of the substrate 210.

Figure 4C:
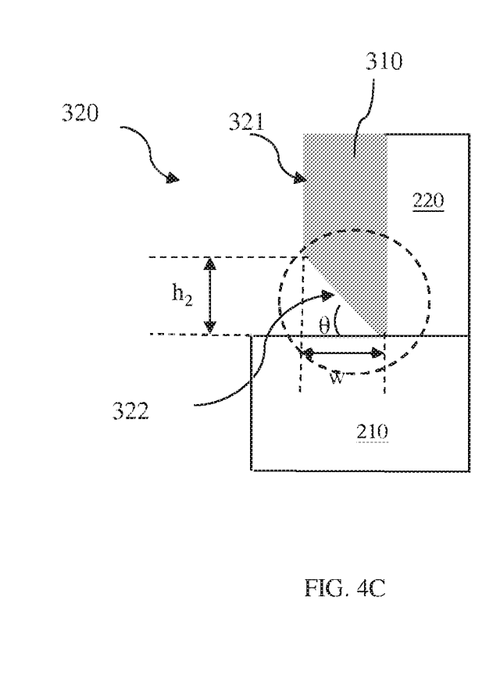

In one embodiment, the first height $h_1$ is close to zero, the second height $h_2$ is in a range of about 5 nm to 10 nm and the width w is in a range of about 5 nm to 10 nm. In another embodiment, the cavity 320 has a triangle shape, which has an angle ($\theta$) with respect to horizontal surface, as shown in FIG. 4C. In one embodiment, the angle $\theta$ is larger than 10 degree and the bottom width w is in a range of about 5 nm to about 10 nm.

Thus, after forming the cavity 320, the original flat bottom profile of the spacer 310 facing substrate 210 is changed such that the profile of spacer 310 includes an edge that tapers towards the gate stack (e.g. first edge 322). Furthermore, the slated bottom portion of the spacer 310 has a width same as the width of the cavity. Also, at bottom portion of the spacer 310, a gap between an outer edge of the spacer 310 and the surface of the substrate is as same as the second height $h_2$ of the cavity 320.

Figure 5:
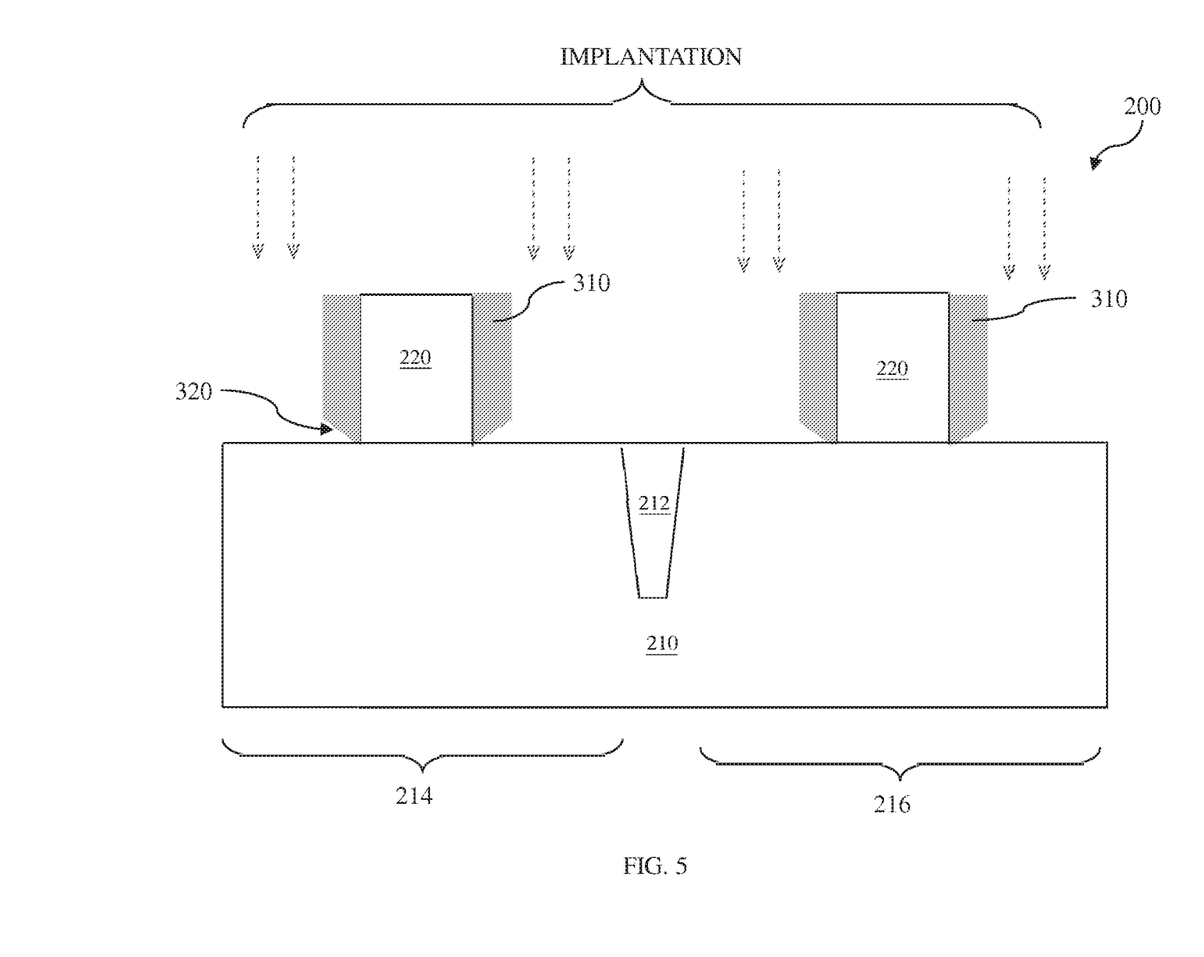

Referring to FIGS. 1 and 5, the method 100 proceeds to step 108 by performing various ion implantations to the substrate 210. In one embodiment, a light doped drain (LDD) regions are formed by an ion implantation process using the gate stack 220 as an implanting mask. In one embodiment, the LDD regions are substantially aligned with the edges of the gate stack 220. In another embodiment, where the spacer 310 is present, the LDD regions are offset from the edge of the gate stack 220 by the spacer 310. Additionally, a halo/pocket implantation process may be implemented to eliminate the short channel effect.

Figure 6:
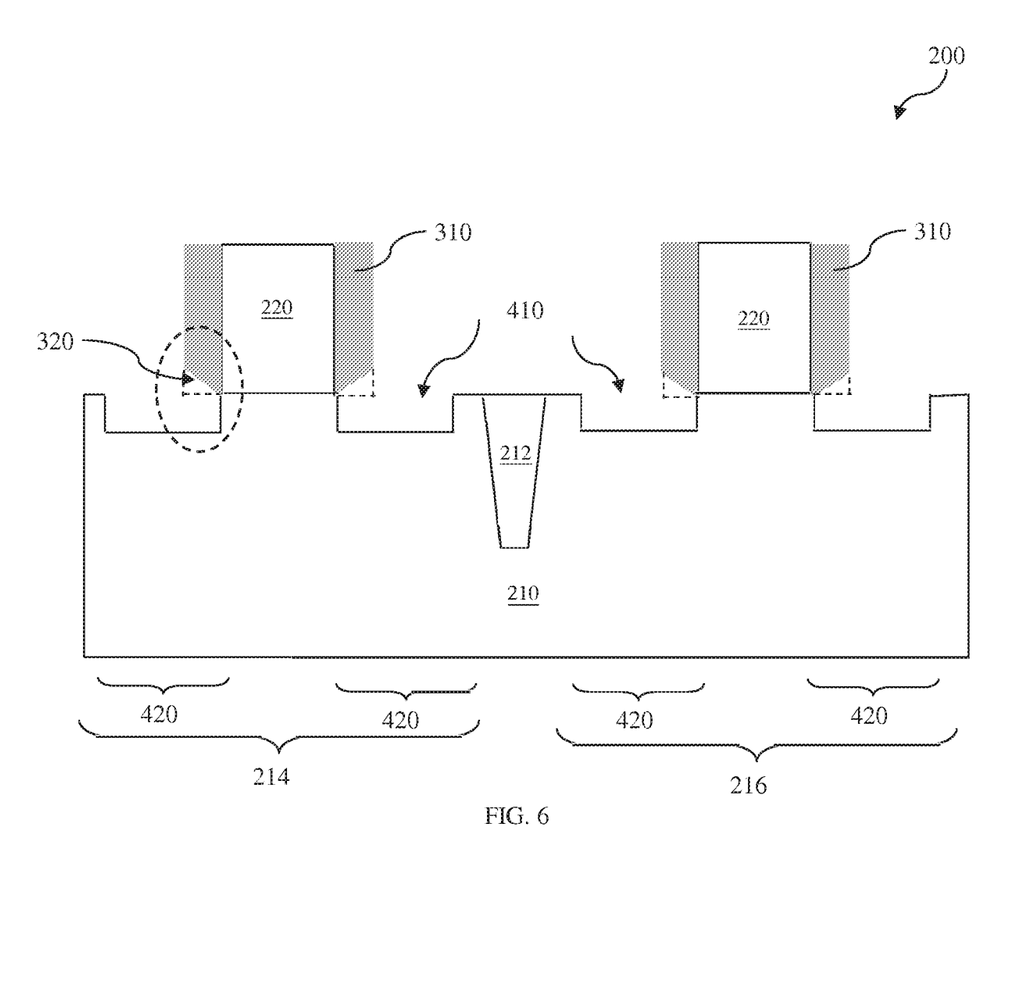

Referring to FIGS. 1 and 6, the method 100 proceeds to step 110 by forming recesses 410 in the first active region 214 and the second active region 216. The recesses 410 are formed by removing portions of the substrate 210 at either side of the gate stack 220. In the present embodiment, the recesses 410 are formed in the first active region 214 and the second active region 216, such that the gate stack 220 interposes the recesses 410. In one embodiment, the recesses 410 are formed in a source/drain region 420 in both of the first and second active regions, 214 and 216. In one embodiment, the substrate 210 is etched through a first patterned hard mask (HM) layer. The first patterned HM layer may include silicon oxide, silicon nitride, silicon oxynitride, or any other suitable dielectric material. The first patterned HM layer may be formed by depositing a material layer by thermal oxidation, chemical CVD, ALD, or any other appropriate method, forming a patterned photoresist (resist) layer by a lithography process, and etching the material layer through the openings of the patterned photoresist layer to form the patterned HM layer.

Then the substrate 210 is etched through the first patterned HM layer to form the recesses 410. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. Dry etching processes may include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching process is controlled to achieve a desired profile of the recesses 410, such that the recess 410 extends to underneath the cavity 320. In one embodiment, an edge of the recess 410 substantially aligned with the gate stack 220.

Figure 7:
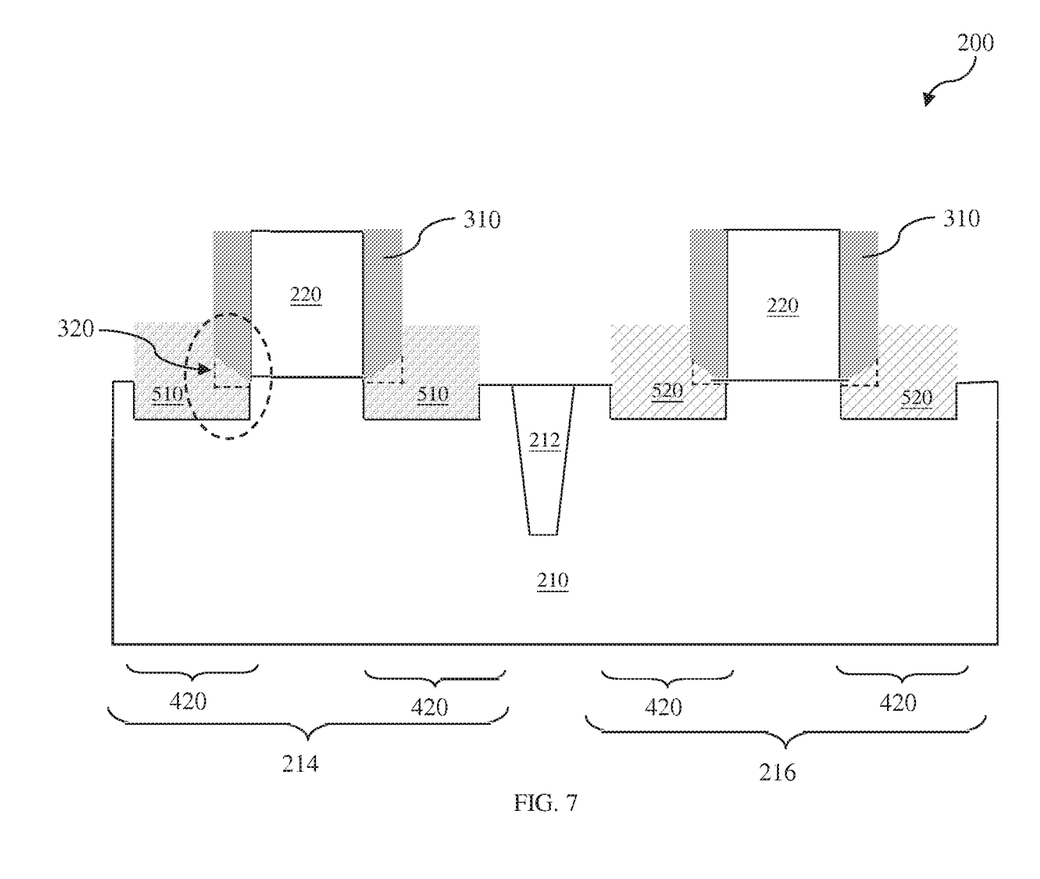

Referring to FIGS. 1 and 7, the method 100 proceeds to step 112 by forming first stressor features 510 in the first active region 214 and second stressor features 520 in the second active region 216 for the strain effect to enhance the mobility in a channel region. The first stressor features 510 are formed over the recesses 410 in the first active region 214 while the second active region 214 is protected by a second patterned HM layer. The second patterned HM layer may include silicon oxide, silicon nitride, silicon oxynitride, or any other suitable dielectric material. The second patterned HM layer may be formed similarly in many respects to the first patterned HM layer discussed above in step 110.

The first stressor features 510 may be formed by epitaxially growing a first semiconductor material over the recesses 410. The first semiconductor material includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). In the present embodiment, the first stressor feature 510 includes an epitaxial silicon germanium (SiGe). The first hard mask layer is then removed by a suitable etching process.

The second stressor features 520 are then formed over the recesses 410 in the second active region 216 while the first active region 212 is protected by a third HM layer. The third patterned HM layer may include silicon oxide, silicon nitride, silicon oxynitride, or any other suitable dielectric material. The third d patterned HM layer may be formed similarly in many respects to the second patterned HM layer discussed above. The second stressor features 520 may be formed by epitaxially growing a second semiconductor material over the recesses 410. The first semiconductor material includes single element semiconductor material such as Ge or Si; or compound semiconductor materials, such as GaAs, AlGaAs; or semiconductor alloy, such as SiGe, GaAsP. In the present embodiment, the second stressor 520 includes epitaxial Si. The second hard mask layer is them removed by a suitable etching process.

The first and second stressor features, 510 and 520, may be formed by one or more epitaxy or epitaxial (epi) processes. The epitaxial processes may include CVD deposition techniques (e.g., vapor-phase epitaxy (VPE) and/or ultra-high vacuum CVD (UHV-CVD)), molecular beam epitaxy, and/or other suitable processes. In the present embodiment, a thickness of the deposition is controlled to achieve top surfaces of the first and second stressor features are above the slanted bottom portion of the spacer 310. The first and second stressor features, 510 and 520, may also be in-situ doped during the epitaxial process. For example, the epitaxially grown SiGe stressor features 510 may be doped with boron; and the epitaxially grown Si stressor features 520 may be doped with carbon, phosphorous, or both. In the present embodiment, the epitaxial grown Si stressor feature is doped with phosphorous, SiP. If the first and second stressor features, 510 and 520, are not in-situ doped, a second implantation process (e.g., a junction implant process) is performed to dope the first stressor 510, or the second stressor 520. One or more annealing processes may be performed to activate dopants in the epitaxial stressors. The annealing processes may include rapid thermal annealing (RTA) and/or laser annealing processes.

In the present embodiment, the cavities 320, in both of the first active region 214 and the second active region 216 are fully filled by the first and the second stressor features, 510 and 520, respectively. In other words, the first and second stressor features, 510 and 520, form a bottom portion of the respective spacers 310 with the slanted profile towards to the gate stack 220.

The IC device 200 may undergo CMOS or MOS technology processing to form various features and regions known in the art. For example, an interlayer dielectric (ILD) layer is formed over the substrate 210 between the gaps of the gate stacks 220. The ILD layer includes silicon oxide, silicon oxynitride, low k dielectric material or other suitable dielectric materials. The ILD layer may include a single layer or alternative multiple layers. The ILD layer is formed by a suitable technique, such as CVD, ALD and spin-on (SOG). A chemical mechanical polishing (CMP) process may be performed thereafter to remove excessive ILD layer and planarize the top surface of the IC device 200.

For another example, source/drain (S/D) features are formed in the S/D regions 420. The S/D features may be formed by epitaxially growing a semiconductor material layer in the S/D regions 420. The semiconductor material layer includes Ge, Si, GaAs, AlGaAs, SiGe, GaAsP, or other suitable material. The S/D features may be formed by one or more epitaxy or epitaxial (epi) processes. The S/D features may be in-situ doped during the epi process.

For yet another example, the dummy gate stack 220 is replaced by a high-k/metal gate (HK/MG) stack. In one embodiment, the dummy gate 220 is removed to form gate trench. The dummy gate 220 may be removed by selective wet etch or selective dry etch, such that having an adequate etch selectivity with respect to the spacer 310. The HK/MG stack is then formed in the gate trench. The HK/MG stack includes a gate electric layer and a MG electrode. The gate dielectric layer may include an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited over the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately in the first region 214 (for the PFET) and in the second region 216 (for the NFET) with different metal layers.

For example, subsequent processing may form various contacts/vias/lines and multilayers interconnect features (e.g., metal layers and interlayer dielectrics) on the substrate 210, configured to connect the various features to form a functional circuit that includes one or more FETs. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced, eliminated, or moved around for additional embodiments of the method 100. The device 200 may undergo further CMOS or MOS technology processing to form various features and regions known in the art.

Based on the above, the present disclosure offers an IC device employs a structure of having stressor feature as a bottom portion of a gate spacer, which has a slanted bottom profile towards to the gate stack. The structure induces an efficient strain to the gate region to improve device performance, such as improving Vtsat, Isoff, Idsat, drain-induced barrier lowering (DIBL) and channel stress. The present disclosure also offers a quite feasible method for forming the IC device with the structure.

The present disclosure provides many different embodiments of an IC device. The IC device includes a gate stack disposed over a surface of a substrate and a spacer disposed along a sidewall of the gate stack. The spacer has a tapered edge that faces the surface of the substrate while tapering toward the gate stack. Therefore the tapered edge has an angle with respect to the surface of the substrate.

The present disclosure also provides another embodiment of an IC device. The device includes a substrate having a p-type field-effect transistor (PFET) region and an n-type field-effect transistor (NFET) region. The device also includes a first high-k/metal gate (HK/MG) stack protrudes above a surface of the substrate in a vertical direction in the PFET region and a second HK/MG stack protrudes above a surface of the substrate in a vertical direction in the NFET region. The device also includes spacers along sidewalls of the first and second HK/MG stacks, having a slanted bottom profile towards to the respective HK/MG stack. The slanted bottom profile has an angle ($\theta$) with respect to a horizontal surface of the substrate. The device also includes a first stressor feature adjacent to the first HK/MG stack, including underneath the slanted bottom of the spacer and a second stressor feature adjacent to the second HK/MG stack, including underneath the slanted bottom of the spacer.

The present disclosure also provides a method of fabricating an integrated circuit device. The method forming a spacer along a sidewall of a gate stack disposed over a substrate, forming a cavity at a bottom of the spacer. The cavity has a slanted top profile towards the gate stack. The method also includes recessing the substrate at either side of the gate stack, including the substrate at a bottom of the cavity. The method also includes forming a stressor feature in the recessed substrate and in the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack over a substrate;
    forming a sidewall spacer along a sidewall of the gate stack;
    removing a portion of the sidewall spacer to form a cavity within the sidewall spacer, the cavity having a decreasing height towards the gate stack, wherein the removing of the portion of the sidewall spacer to form the cavity within the sidewall spacer forms a modified sidewall spacer, and wherein the modified sidewall spacer includes an inclined edge that faces the substrate while inclining toward the gate stack and another edge that is substantially perpendicular to the substrate that physically contacts the inclined edge, wherein the another edge includes a portion that extends to the substrate beyond the point of contact with the inclined edge, wherein the another edge and the inclined edge are formed of the same material;
    after removing the portion of the sidewall spacer to form the cavity within the sidewall spacer, implanting dopants into a portion of the substrate;
    removing the portion of the substrate that includes the implanted dopants to form a recess within the substrate; and
    forming a source/drain feature in the recess.

2. The method of claim 1, wherein the portion of the substrate defines a bottom surface of the cavity prior to the removing of the portion of the substrate.

3. The method of claim 1, wherein the forming of the sidewall spacer along the sidewall of the gate stack further includes forming the sidewall spacer directly on the portion of the substrate such that the portion of the substrate is covered by the sidewall spacer.

4. The method of claim 3, wherein the removing of the portion of the sidewall spacer to form the cavity within the sidewall spacer further includes removing the portion of the sidewall spacer to expose the portion of the substrate.

5. The method of claim 1, wherein the forming of the source/drain feature in the recess further includes forming the source/drain feature within the cavity such that the source/drain feature interfaces with portions of the sidewall spacer defining the cavity.

6. The method of claim 1, wherein the forming of the sidewall spacer along the sidewall of the gate stack includes:
    depositing a dielectric layer over the gate stack; and
    performing an anisotropic etching process on the dielectric layer.

7. The method of claim 1,
    forming another gate stack over the substrate;
    forming another sidewall spacer along another sidewall of the another gate stack;
    removing a portion of the another sidewall spacer to form another cavity within the another sidewall spacer; and
    forming another source/drain feature in the another cavity, the another source/drain feature being formed of a different material than the source/drain feature.

8. A method comprising:
    forming a gate stack over a substrate;
    forming a sidewall spacer along a sidewall of the gate stack;
    removing a portion of the sidewall spacer to form a modified sidewall spacer, the modified sidewall spacer including an inclined edge that faces the substrate while inclining toward the gate stack, wherein the modified sidewall spacer further includes another edge that is substantially perpendicular to the substrate that physically contacts the inclined edge, wherein the another edge includes a portion that extends to the substrate beyond the point of contact with the inclined edge, wherein the another edge and the inclined edge are formed of the same material; and
    forming a source/drain feature that interfaces with the inclined edge.

9. The method of claim 8, further comprising removing a portion of the substrate to form a recess, and
    wherein the forming of the source/drain feature that interfaces with the inclined edge further includes forming the source/drain feature in the recess.

10. The method of claim 9, wherein the portion of the substrate is disposed directly under the inclined edge.

11. The method of claim 8, wherein the distance between a top surface of the substrate and the inclined edge decreases as the inclined edge inclines toward the gate stack.

12. The method of claim 8, wherein the forming of the source/drain feature incudes performing an epitaxial process.

13. The method of claim 8, wherein the inclined edge interfaces with the substrate after the removing of the portion of the sidewall spacer to form the modified sidewall spacer.

14. The method of claim 8, further comprising:
implanting dopants into a portion of the substrate; and
removing the portion of the substrate that includes the implanted dopants to form a recess within the substrate, and
wherein the forming of the source/drain feature that interfaces with the inclined edge further includes forming the source/drain feature in the recess.

15. A method comprising:
forming a first spacer along a sidewall of a first gate stack disposed over a substrate;
removing a portion of the first spacer to form a first cavity within the first spacer, wherein the first cavity decreases in size as the cavity extends towards the first gate stack, wherein the removing of the portion of the first spacer to form the first cavity within the first spacer forms a first modified sidewall spacer, wherein the first modified sidewall spacer includes an inclined edge that faces the substrate while inclining toward the first gate stack and another edge that is substantially perpendicular to the substrate that physically contacts the inclined edge, wherein the another edge includes a portion that extends to the substrate beyond the point of contact with the inclined edge, wherein the another edge and the inclined edge are formed of the same material;
after removing the portion of the first spacer to form the first cavity within the first spacer, forming a first recess in the substrate adjacent the first gate stack without the recess extending under the first gate stack; and
forming a first source/drain feature in the first recess.

16. The method of claim 15, further comprising:
forming a second spacer along a sidewall of a second gate stack disposed over the substrate;
removing a portion of the second spacer to form a second cavity within the second spacer;
forming a second recess in the substrate adjacent the second gate stack; and
forming a second source/drain feature in the second recess and the second cavity, the second source/drain feature being formed of a different material than the first source/drain feature.

17. The method of claim 16, wherein the first source/drain feature includes silicon and the second source/drain feature includes germanium.

18. The method of claim 15, wherein the removing of the portion of the first spacer to form the first cavity within the first spacer includes performing a wet etching process.

19. The method of claim 15, wherein the removing of the portion of the first spacer to form the first cavity within the first spacer includes performing a dry etching process.

20. The method of claim 15, further comprising implanting a dopant into a portion of the substrate after the removing of the portion of the first spacer to form the first cavity within the first spacer, and
wherein the forming of the first recess in the substrate adjacent the first gate stack includes removing at least some of the portion of the substrate.

* * * * *